United States Patent [19]
Hieda et al.

[11] Patent Number: 5,998,821
[45] Date of Patent: Dec. 7, 1999

[54] DYNAMIC RAM STRUCTURE HAVING A TRENCH CAPACITOR

[75] Inventors: Katsuhiko Hieda, Yokohama; Akihiro Nitayama, Kawasaki, both of Japan

[73] Assignee: Kabushiki Kaisha Toshiba, Kawasaki, Japan

[21] Appl. No.: 08/859,851

[22] Filed: May 21, 1997

[51] Int. Cl.⁶ .......... H01L 27/108; H01L 29/76; H01L 29/94; H01L 31/119
[52] U.S. Cl. .......... 257/301; 257/296; 257/305
[58] Field of Search .......... 257/296, 301, 257/303, 305

[56] References Cited

U.S. PATENT DOCUMENTS

| | | | |
|---|---|---|---|
| 4,763,181 | 8/1988 | Tasch, Jr. | 357/23.6 |
| 4,784,969 | 11/1988 | Nitayama | 437/41 |
| 4,792,834 | 12/1988 | Uchida | 357/23.6 |
| 4,794,434 | 12/1988 | Pelley, III | 357/23.6 |
| 5,006,910 | 4/1991 | Taguchi | 357/23.6 |
| 5,012,308 | 4/1991 | Hieda | 357/23.6 |
| 5,065,273 | 11/1991 | Rajeevakumar | 361/313 |
| 5,097,381 | 3/1992 | Vo | 361/313 |
| 5,119,155 | 6/1992 | Hieda et al. | 357/23.6 |
| 5,168,366 | 12/1992 | Sasaki | 257/297 |
| 5,170,243 | 12/1992 | Dhong et al. | 365/208 |
| 5,170,372 | 12/1992 | Wong | 257/304 |
| 5,187,566 | 2/1993 | Yoshikawa et al. | 257/301 |
| 5,200,354 | 4/1993 | Om et al. | 437/52 |
| 5,250,829 | 10/1993 | Bronner et al. | 257/301 |
| 5,309,008 | 5/1994 | Watanabe | 257/304 |
| 5,315,543 | 5/1994 | Matsuo et al. | 365/149 |
| 5,349,218 | 9/1994 | Tadaki et al. | 257/296 |
| 5,362,663 | 11/1994 | Bronner et al. | 437/52 |
| 5,363,327 | 11/1994 | Henkles et al. | 365/149 |
| 5,372,966 | 12/1994 | Kohyama | 437/52 |
| 5,414,285 | 5/1995 | Nishihara | 257/301 |
| 5,432,365 | 7/1995 | Chin et al. | 257/301 |
| 5,442,211 | 8/1995 | Kita | 257/301 |
| 5,508,541 | 4/1996 | Hieda et al. | 257/301 |
| 5,512,767 | 4/1996 | Noble, Jr. | 257/301 |
| 5,528,062 | 6/1996 | Hsieh et al. | 257/298 |

FOREIGN PATENT DOCUMENTS 6-104399  4/1994  Japan .

OTHER PUBLICATIONS

1995 Symposium on VLSI Technology Digest of Technical Papers, pp. 137–138, "0.29 um² Trench Cell Technologies for 1G–bit DRAMs with Open/Folded–Bit–Line Layout and Selective Growth Technique," M. Noguchi et al, et al. (1995).

*Primary Examiner*—Mahshid Saadat
*Assistant Examiner*—Jesse A. Fenty
*Attorney, Agent, or Firm*—Banner & Witcoff, Ltd.

[57] ABSTRACT

A dynamic RAM structure comprises a trench formed on a p-type Si substrate, a capacitor oxide film formed in such a manner as to cover an inner wall of the trench, a polysilicon film being a capacitor storage node electrode for burying the trench covered with the capacitor oxide film, an epitaxial Si layer formed on the Si substrate including an upper portion of the polysilicon film, a source/drain layer of a MOS transistor formed in the epitaxial Si layer, and a surface strap diffusion layer formed in the epitaxial Si layer in such a manner as to come in contact with the source/drain layer.

16 Claims, 10 Drawing Sheets

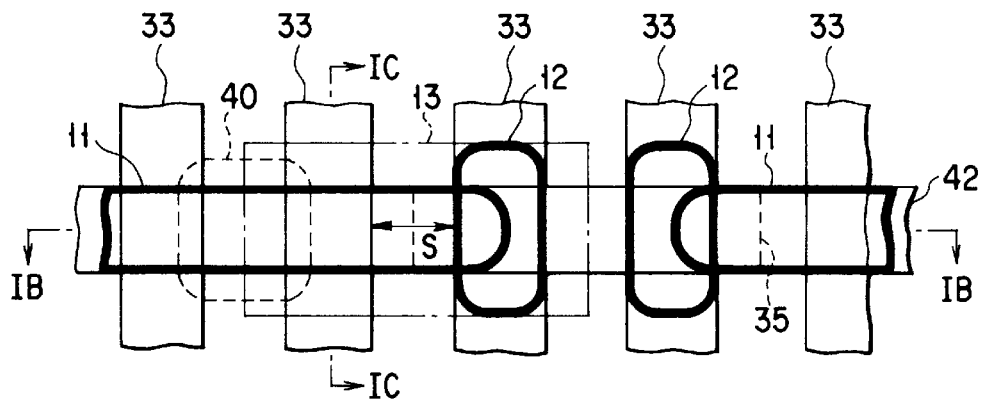
F I G. 1A
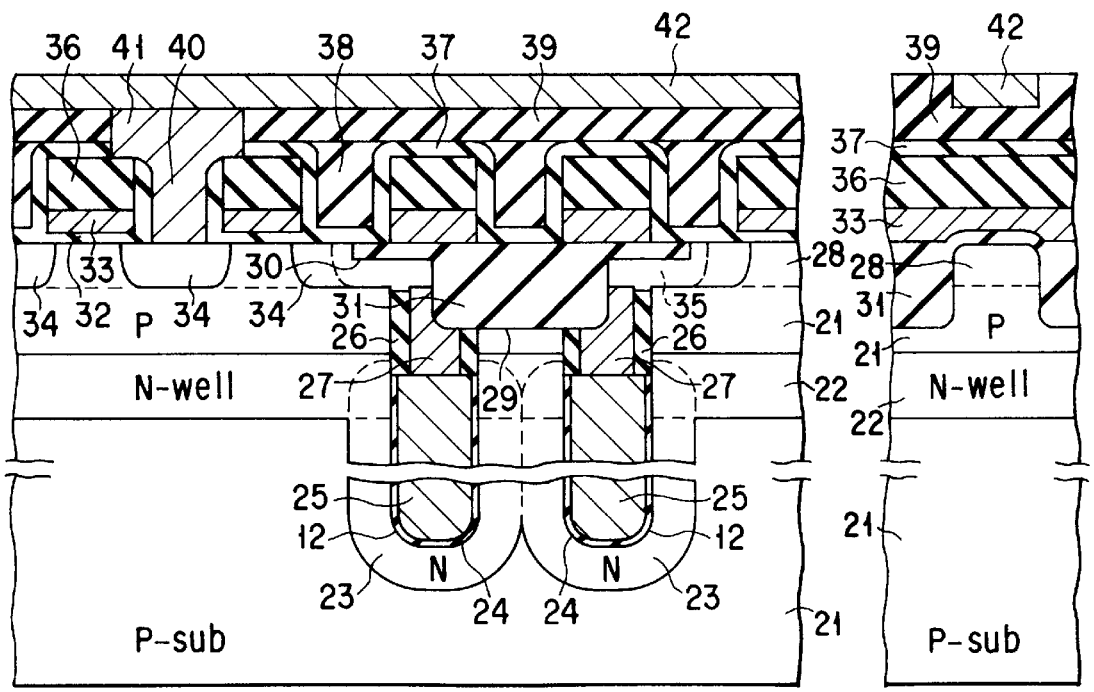
F I G. 1B  F I G. 1C

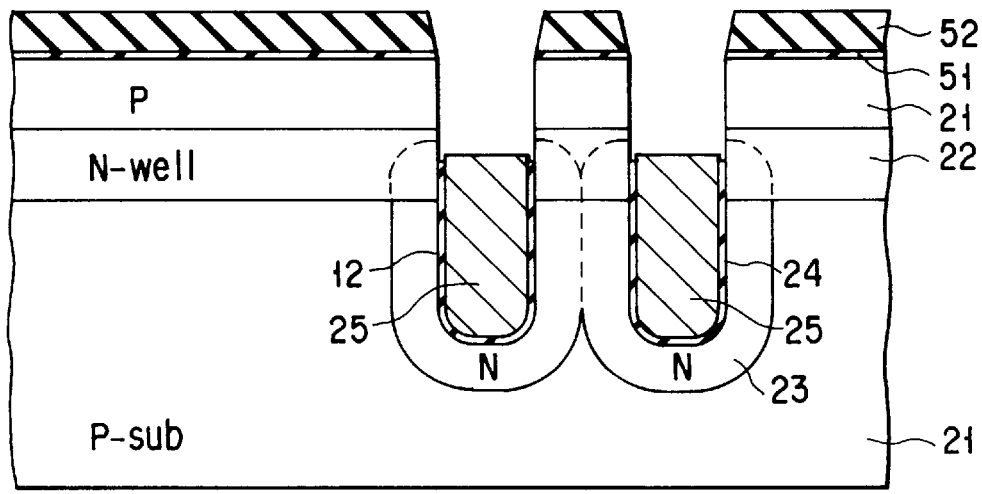
F I G. 2
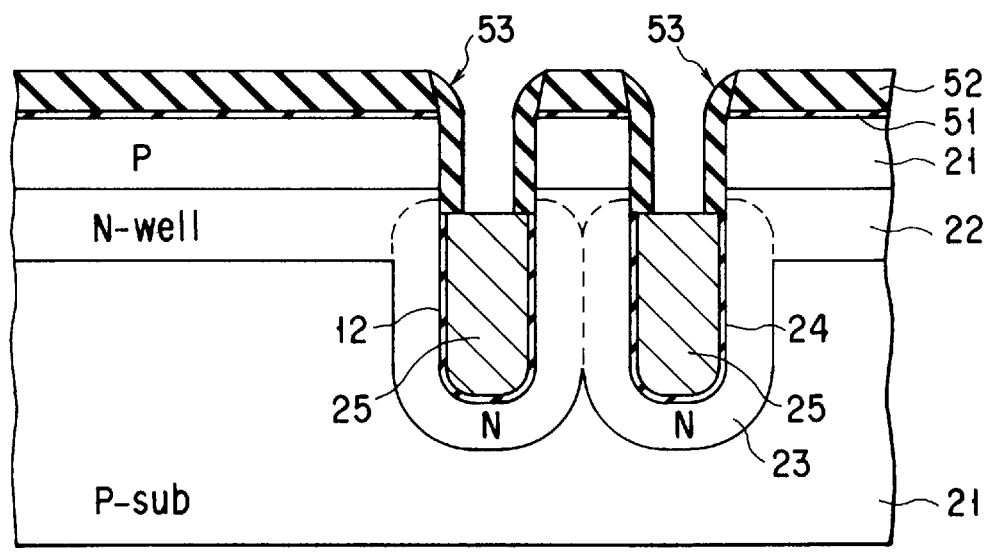
F I G. 3

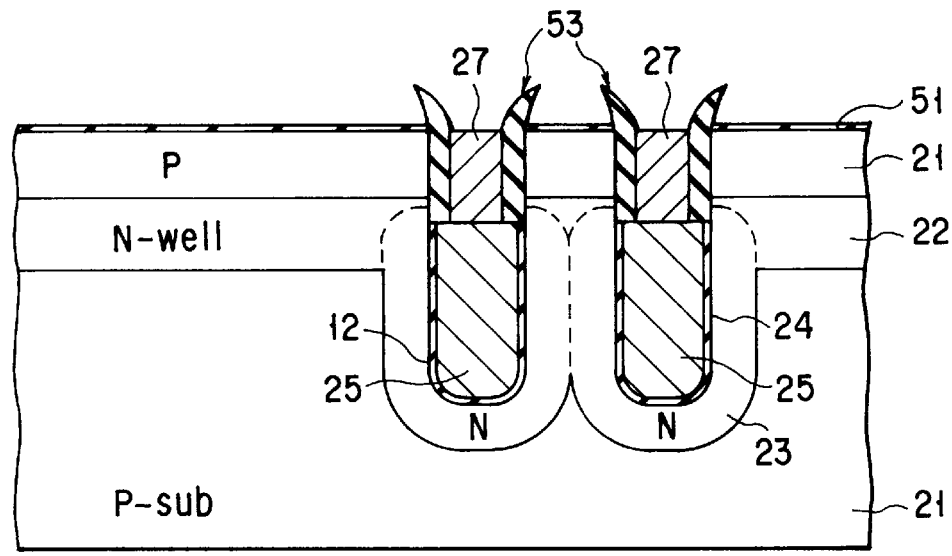
F I G. 4
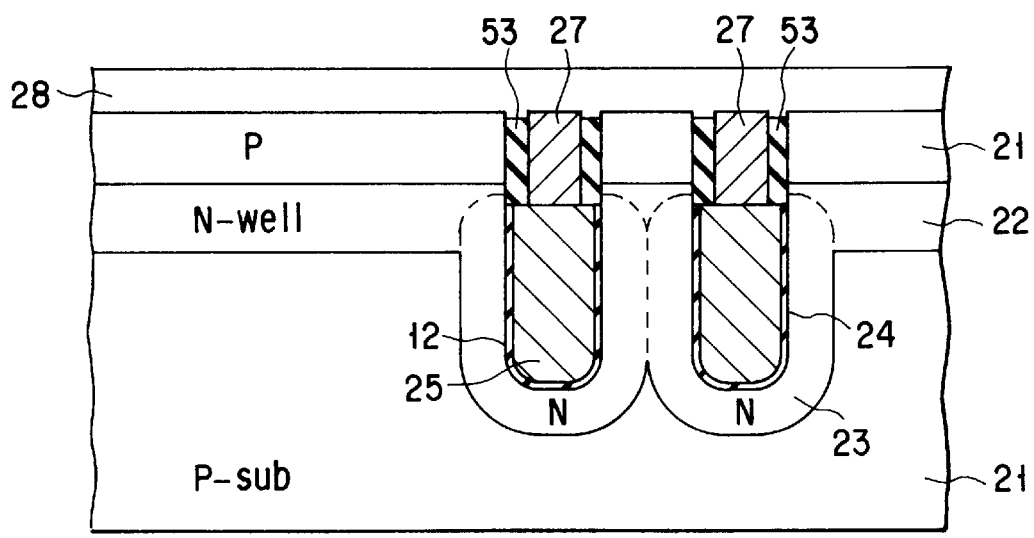
F I G. 5

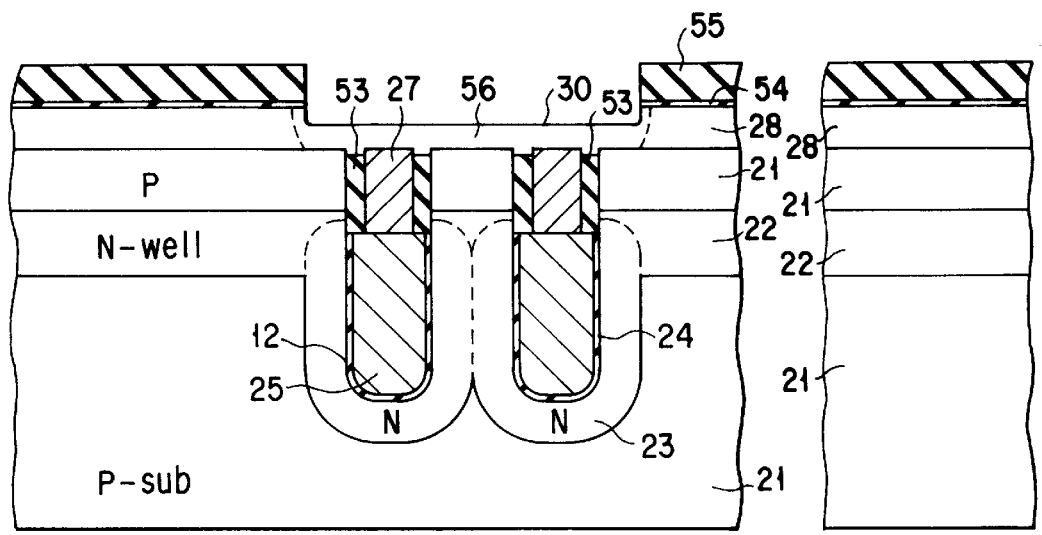
F I G. 6A  F I G. 6B
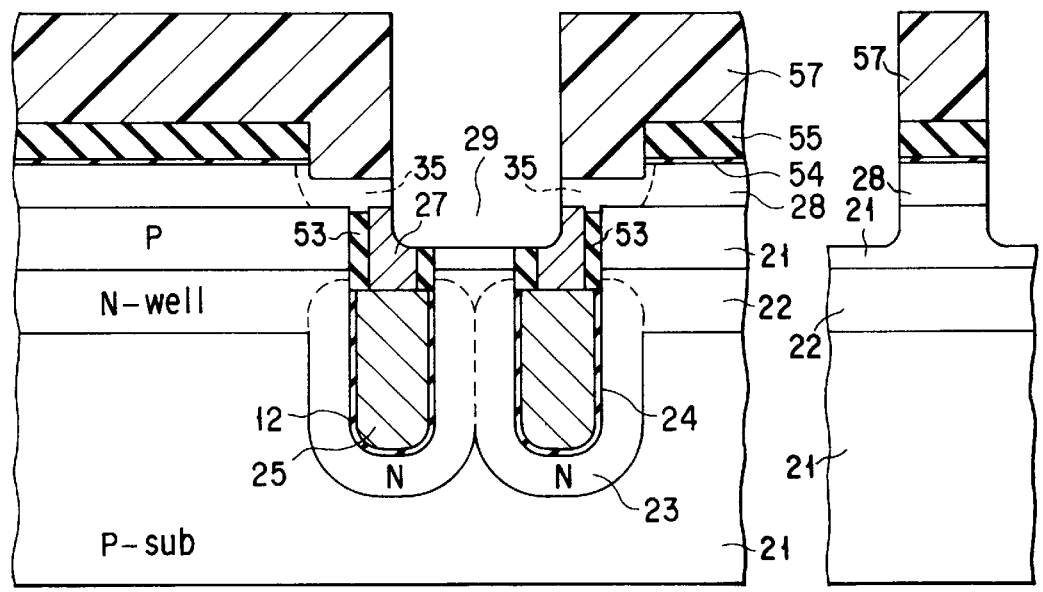
F I G. 7A  F I G. 7B

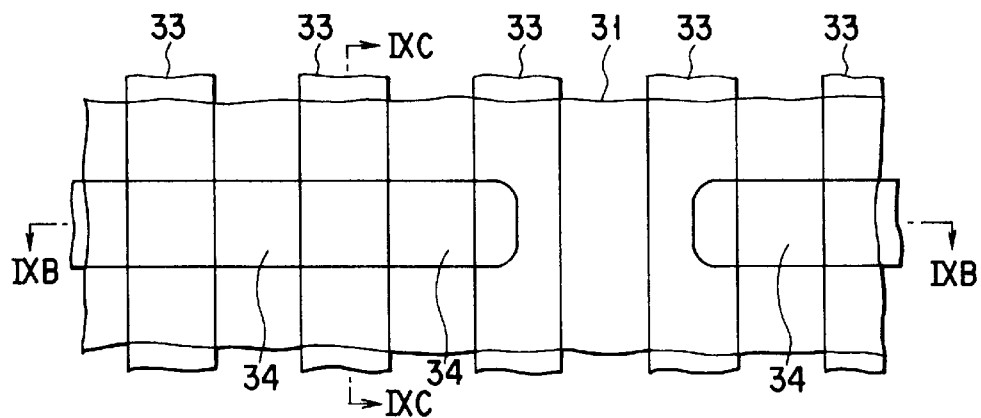
F I G. 9A
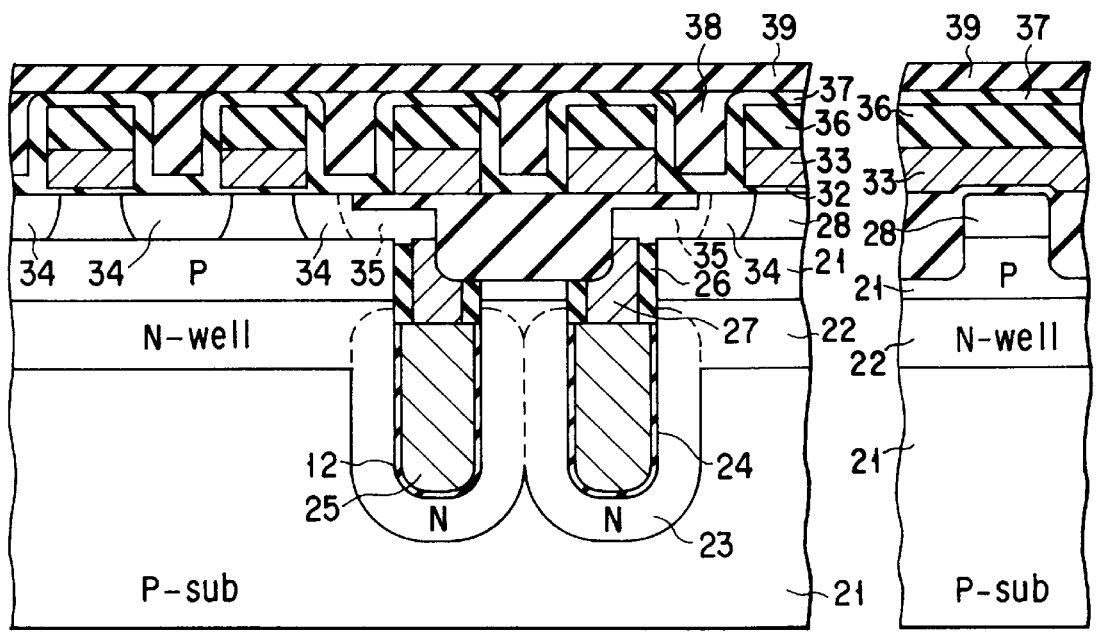
F I G. 9B    F I G. 9C

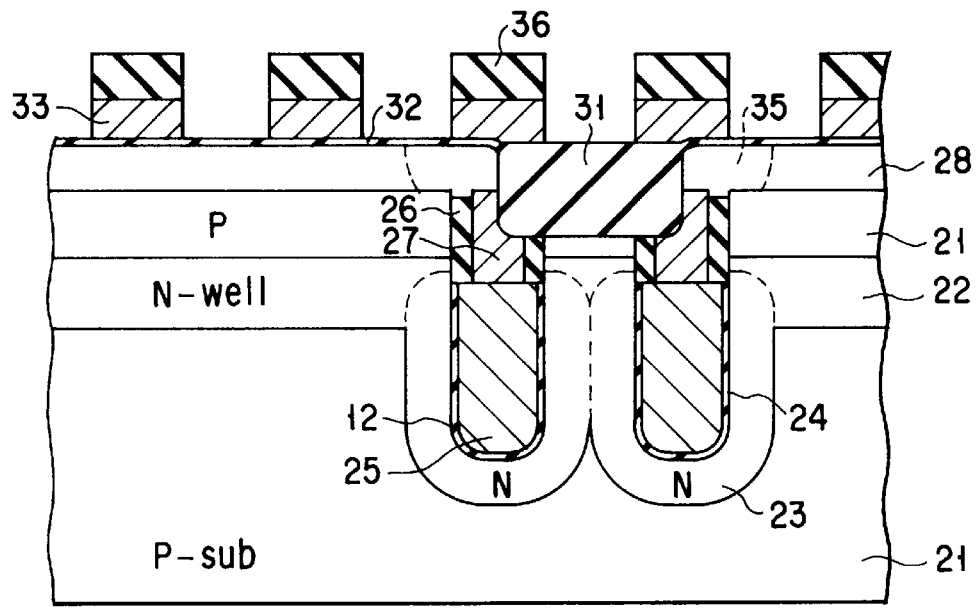
F I G. 12
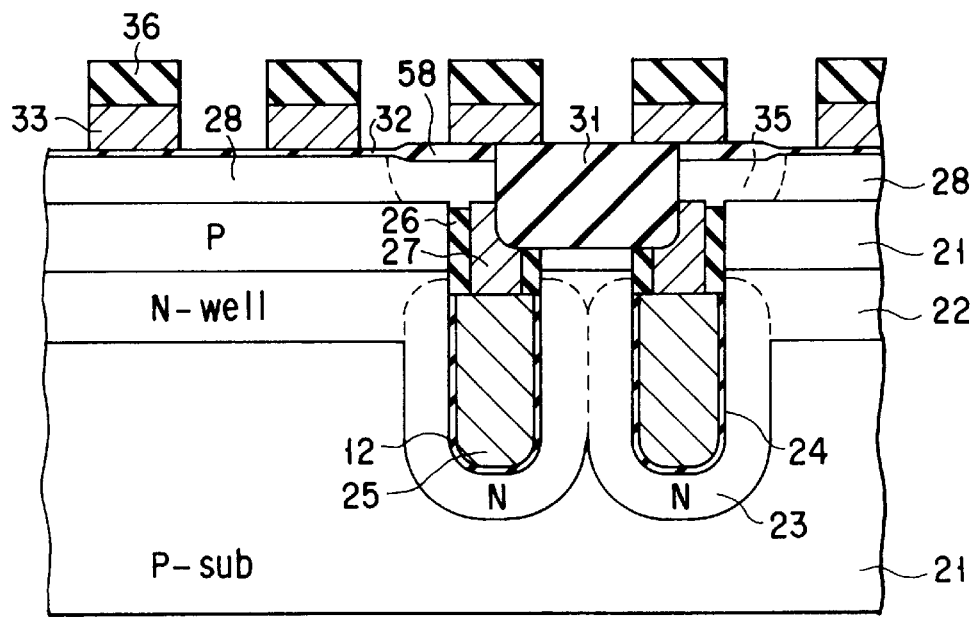
F I G. 13

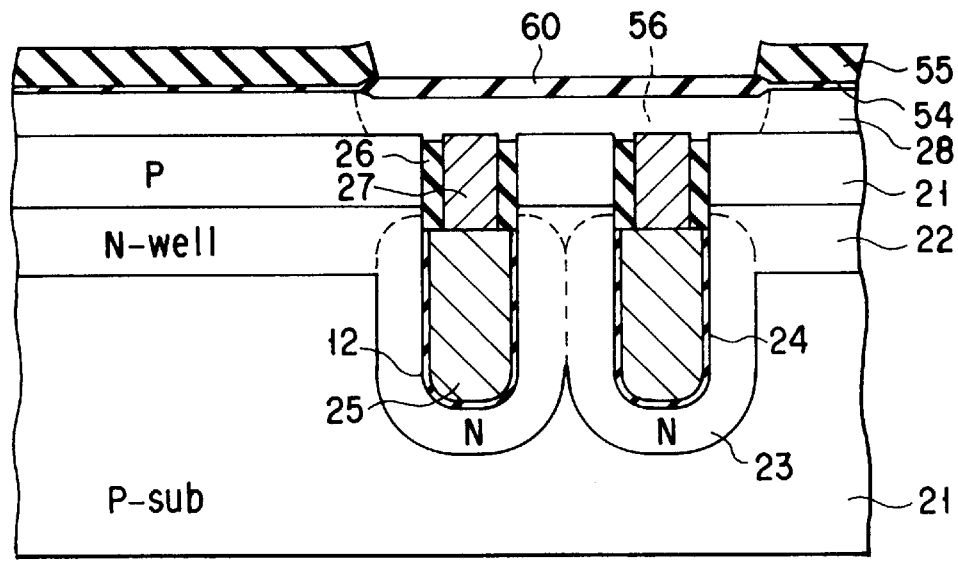
F I G. 14
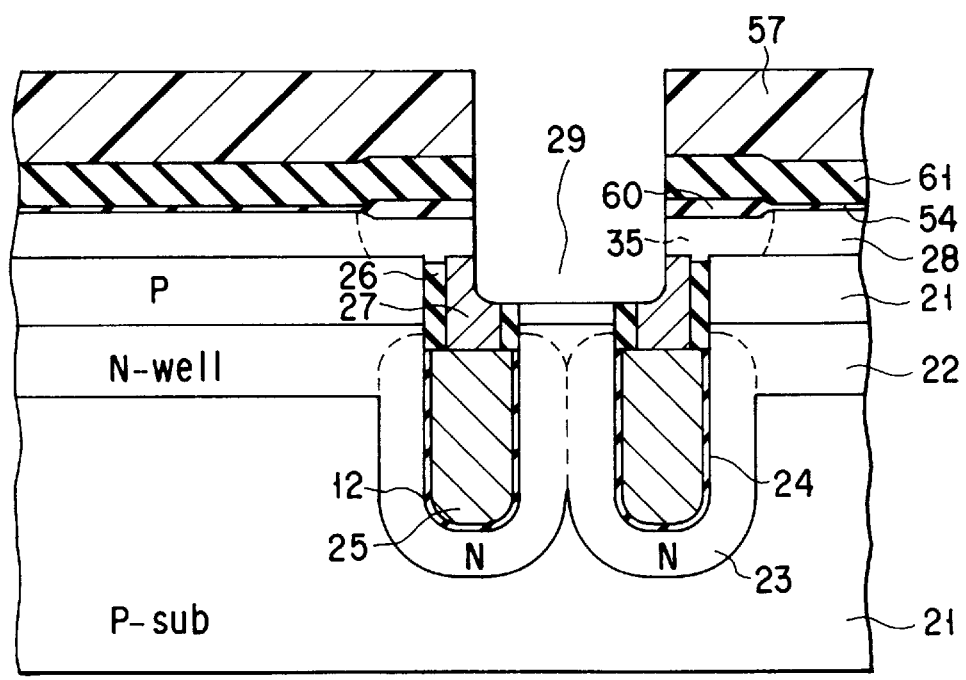
F I G. 15

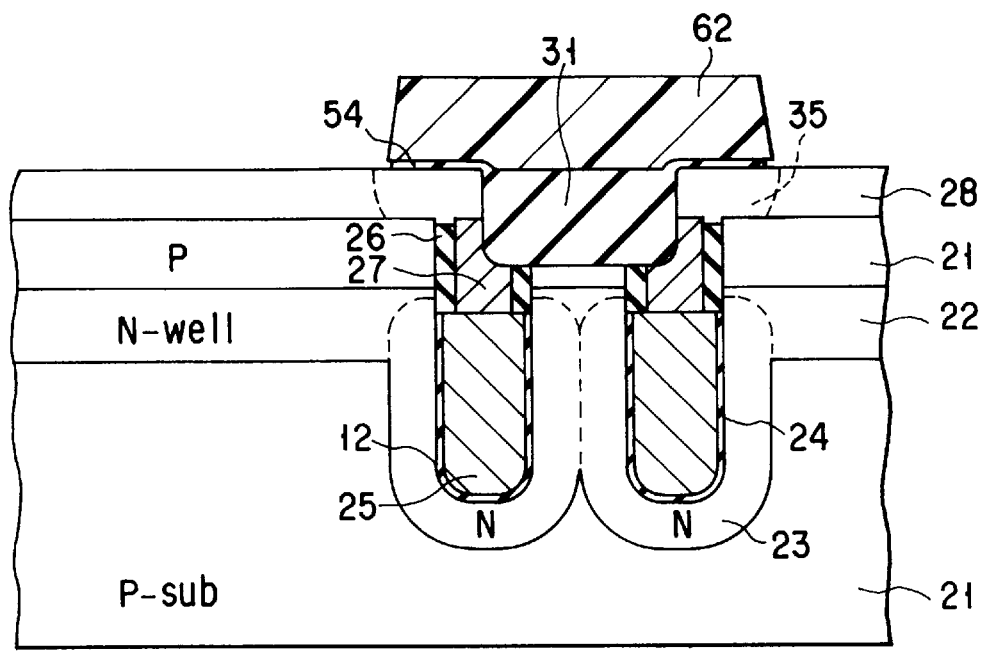
F I G. 16
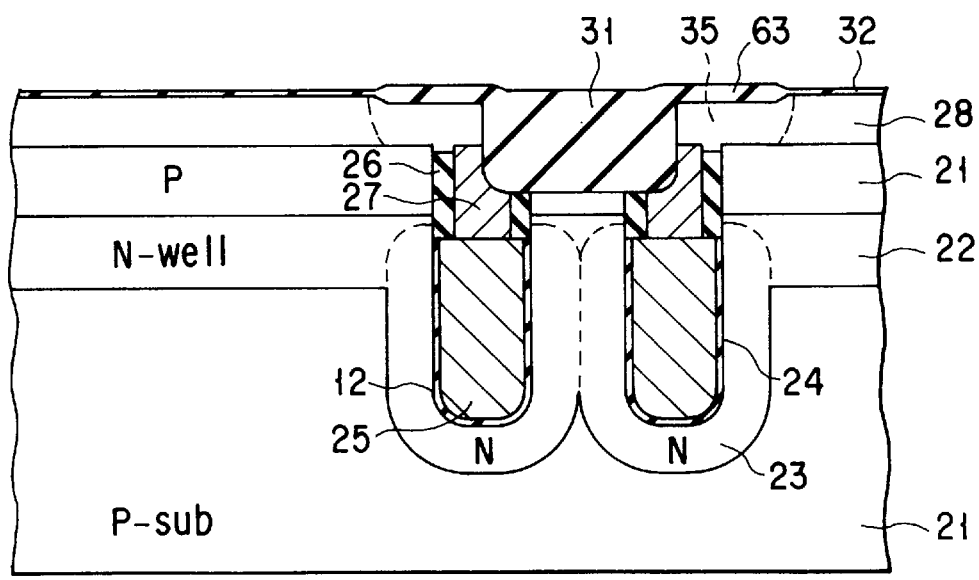
F I G. 17

DYNAMIC RAM STRUCTURE HAVING A TRENCH CAPACITOR

BACKGROUND OF THE INVENTION

The present invention relates to a dynamic RAM structure in which a memory cell comprises one MOS transistor and one capacitor and the manufacturing method thereof.

Recently, an integration of the dynamic RAM (DRAM) is rapidly advanced. In order that the DRAM may have a further higher integration, such various cells as a so-called stack-type cell in which the capacitors are stacked on the transistor, a so-called trench-type cell in which a trench is formed in a silicon substrate in such a manner that an inner wall of the trench is used as the capacitor and the like are proposed as a memory cell structure. More specifically, in case of the trench-type cell, the deeper a depth of the trench becomes, the more a storage capacitance (Cs) can be increased. Accordingly, the trench-type cell is considered as such a memory cell structure that a large storage capacitance can be realized even if the memory cell has less area.

Furthermore, in the trench-type cell, as means for electrically connecting one electrode of the capacitor in the trench to a source/drain diffusion layer of a selecting MOS transistor, there are a surface strap scheme in which a surface strap is disposed on a substrate surface for connecting, and a buried strap scheme (BS scheme) in which a side-wall contact is formed on a side wall of the upper portion of the trench. Instead of the surface strap scheme, the trench-type cell of the BS scheme is applied to the DRAM of 256M-bit generation. The surface strap (SS) scheme needs an additional cell area to connect one electrode of the capacitor to a source/drain diffusion layer of the MOS transistor. Therefore buried strap scheme (BS scheme) is better than SS scheme in the cell area scaling point of view.

However, in the trench-type cell of the BS scheme, it is not easy to control the depth of the side-wall contact along the upper portion of the trench, and it is difficult to reduce a distance between a gate conductor (GC) of the MOS transistor and a deep trench (DT). The depth from the side-wall contact is not so large, around 0.1 $\mu$m. However, the depth from the Si surface is large, around 0.20 $\mu$m. In the case of alignment error between DT and GC, this deeper diffusion layer works as a source/drain diffusion layer with a deeper Xj (Junction depth). Therefore, there is such a problem that it is difficult to reduce the cell area for a next generation.

For example, such a typical trench-type cell that a trench capacitor's storage node electrode is to the source/drain of the MOS transistor by using the BS scheme is disclosed in Technical Digest Paper, pp. 627 to 630, IEDM, 1993. Although this design of the cell is very excellent in 0.25 $\mu$m-rule generation, since a side-wall diffusion area is formed on the side-wall of the upper portion of the trench at a depth of approximately 0.2 $\mu$m from the Si surface, it is difficult to reduce the distance between the gate conductor (GC) of the MOS transistor and a deep trench capacitor. That is, when the side-wall diffusion area approaches the gate conductor of the MOS transistor, the side-wall diffusion area becomes the source/drain itself of the MOS transistor, whereby shapes of the source and drain become asymmetrical. Accordingly there is such a problem that a punch-through occurs. Moreover, this asymmetrical shape is not preferable for further scaling of the gate length of the MOS transistor. Furthermore, such a BS scheme is needed to precisely control the depth of the buried strap and a surface condition (cleanness) in a side-wall area. So as to take a stable contact, it is necessary to clean the side-wall area. Moreover, since the side-wall area is required to be deeper, it is necessary to form a deeper Shallow Trench Isolation (STI) in order to cut the diffusion area off from the side-wall. However, since in order that the deeper STI is formed, it is necessary to bury a deeper STI area with high aspect ratio by using an $SiO_2$ film, it is difficult to manufacture the dynamic RAM structure.

In "Symposium on VLSI Technology Digest of Technical Paper, p. p. 137 to 138, 1995", such a technique is disclosed wherein an SEG (selective-epitaxial growth) technique is used so as to form an SEG layer on an active area and a storage node of a trench capacitor thereby one part of the SEG layer is used as a strap electrode.

However, in the technique, a field isolation layer is formed prior to forming the SEG layer. The field isolation layer is formed before forming the SEG layer, so that a polysilicon layer grows on the field isolation layer during the SEG. An Si layer having less crystallizability results in one part of the channel along the field isolation layer in a longitudinal direction of the channel of the MOS transistor and the channel region. There is the problem that a leakage current is increased between the source and the drain of the MOS transistor through these polysilicon layers.

BRIEF SUMMARY OF THE INVENTION

Accordingly, it is an object of the present invention to provide a dynamic RAM structure which can be easily manufactured and in which an area of a memory cell can be reduced.

According to one aspect of the present invention, there is provided a dynamic RAM structure which comprises a dynamic RAM structure in which a plurality of memory cells consisting of a MOS transistor and a capacitor are integrated on a semiconductor substrate, comprising: a semiconductor substrate; a trench formed in the semiconductor substrate; a first insulating film formed in such a manner as to cover an inner wall of a lower portion of the trench; a second insulating film formed in such a manner as to cover an inner wall of an upper portion of the trench; a first conductive layer for a storage electrode formed in such a manner as to bury the trench covered with the first insulating film; a second conductive layer formed in such a manner as to bury the trench covered with the second insulating film; a diffusion area formed in the semiconductor substrate to surround a lower portion of the trench; a semiconductor layer formed on the substrate including the second conductive layer; a field isolation layer having a lower surface located below an interface between the semiconductor layer and the semiconductor substrate, dividing the semiconductor layer into a plurality of active areas, and having an upper surface free of contact with the semiconductor layer; a source/drain diffusion layer of the MOS transistor formed in a layer including the semiconductor layer; and a surface strap layer formed in the semiconductor layer and electrically connecting the second conductive layer and the source/drain diffusion layer together.

According to another aspect of the present invention, there is provided a method of manufacturing a dynamic RAM structure which comprises the steps a method of manufacturing dynamic RAM structure in which a plurality of memory cells consisting of a MOS transistor and a capacitor are integrated on a semiconductor substrate, comprising the steps: preparing a semiconductor substrate of a first conductive type; forming a first trench formed for a capacitor in the semiconductor substrate by means of a selective etching; diffusion impurity of a second conductive type into the semiconductor substrate from a lower part of an inner surface of the first trench, thereby forming a diffusion layer which surves as an electrode of the capacitor; forming a first insulating film so as to cover the inner wall of the lower portion of the first trench; forming a first conductive layer for a storage electrode so as to bury the first trench covered with the first insulating film; forming a second insulating film so as to cover the inner wall of the upper portion of the first trench; forming a second conductive layer so as to bury the first trench covered with the second insulating film; forming a semiconductor layer on the substrate including the upper portion of the second conductive layer; introducing selectively impurity of a second conductive type into the semiconductor layer located on the second conductive layer, thereby forming a surface strap layer; forming a second trench for field isolation on the semiconductor layer so that the bottom portion thereof may reach the semiconductor substrate, thereby dividing the semiconductor layer into a plurality of active areas; burying the second trench with an insulating film, thereby electrically isolated into the active areas each other; forming a gate electrode of the MOS transistor on the semiconductor layer via a gate insulating film; and introducing selectively impurity of the second conductive type into the semiconductor layer by the use of the gate electrode as a mask in order to form a source/drain diffusion layer of the MOS transistor and, at a time, to form either source or drain diffusion layer in such a manner as to overlap on the surface trap layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIG. 1A is a plan view of a pattern showing a layout of a 2-bit memory cell of a dynamic RAM according to a first embodiment of the present invention.

FIG. 1B is a cross sectional view taken along a line Ib—Ib of FIG. 1A.

FIG. 1C is a cross sectional view taken along a line Ic—Ic of FIGS. 1A to 1C.

FIG. 2 is a cross sectional view showing a first process when the dynamic RAM of FIGS. 1A to 1C is manufactured.

FIG. 3 is a cross sectional view showing a process next the process of FIG. 2.

FIG. 4 is a cross sectional view showing a process next the process of FIG. 3.

FIG. 5 is a cross sectional view showing a process next the process of FIG. 4.

FIGS. 6A and 6B are cross sectional views showing a process next the process of FIG. 5.

FIGS. 7A and 7B are cross sectional views showing a process next the process of FIG. 6.

FIG. 9A is a plan view of a pattern showing a process next the process of FIG. 8.

FIG. 9B is a cross sectional view taken along a line IXb—IXb of FIG. 9A.

FIG. 9C is a cross sectional view taken along a line IXc—IXc of FIG. 9A.

FIG. 12 is a cross sectional view showing a process next the process of FIG. 11.

FIG. 13 is a cross sectional view of a process according to the method of manufacturing the dynamic RAM according to a third embodiment of the present invention.

FIG. 14 is a cross sectional view of a process according to the method of manufacturing the dynamic RAM according to a fourth embodiment of the present invention.

FIG. 15 is a cross sectional view showing a process next the process of FIG. 14.

FIG. 16 is a cross sectional view of a process according to the method of manufacturing the dynamic RAM according to a fifth embodiment of the present invention.

FIG. 17 is a cross sectional view showing a process next the process of FIG. 16.

DETAILED DESCRIPTION OF THE INVENTION

Figure 8A:
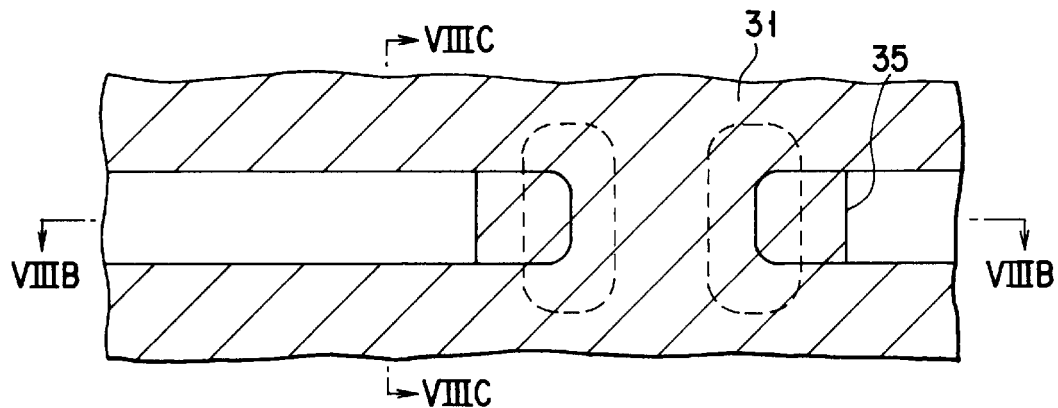
FIG. 8A is a plan view of a pattern showing a process next the process of FIG. 7.

Embodiments of the present invention will be explained with reference to the accompanying drawings.

Embodiment 1

In FIG. 1A, a numeral 11 denotes an active area where a channel and a source/drain diffusion layer of a MOS transistor are formed. The active area 11 is transversely extended, and the adjacent active areas 11 are so located that they are shifted from one another spaced by every half-pitch distance in up-and-down direction with respect to the drawing (FIG. 1A). At both sides of each active area 11, each deep trench (DT) 12 for forming a capacitor is located, respectively. Furthermore, in FIG. 1A, a region 13 surrounded by a one-dotted line denotes a memory cell region where one memory cell is formed.

In a p-type Si substrate (P-sub) 21, an n-type buried well layer (Buried plate electrode) 22 is formed at a depth of approximately 1.3 $\mu$m from the Si substrate surface. The deep trench (DT) 12 passes through the n-type buried well layer 22, and the deep trench (DT) 12 is so formed that the bottom portion thereof may reach into the substrate 21. An n-type diffusion layer 23 which is an electrode faced to the capacitor is formed in the Si substrate 21 around the trench 12 except for the upper portion of the trench 12. One part of the diffusion layer 23 is overlapped on and electrically connected to the n-type buried well layer 22. Furthermore, a node dielectric film 24 is formed on an inner wall of the trench located between a bottom portion of the trench 12 and the buried well layer 22. As the node dielectric film 24, for example, an NO film having a film thickness of, for example, 4 to 5 nm as $SiO_2$ equivalent film thickness (teq) converted into an oxide film, $SiO_2$ film, other stacked film such as $Ta_2O_5$ film, BST ((Ba, Sr) $TiO_3$) film or the like having a $SiO_2$ equivalent film thickness of 4 nm and less is used.

A polysilicon film 25 is so formed that the portion of the trench 12 covered with the node dielectric film 24 is buried. An impurity is introduced into the polysilicon film 25, so that a resistance is lowered. The deeped polysilicon film 25 is used as a storage node electrode of the capacitor. Furthermore, on the inner wall of the trench 12, an $SiO_2$ film 26 is so formed that the inner wall upper than the portion where the node dielectric film 24 is formed is covered. The film thickness of the $SiO_2$ film 26 is sufficiently thicker than that of the node dielectric film 24 (50 nm to 70 nm). Furthermore, a polysilicon film 27 is so formed that a remained portion of the trench 12 on the polysilicon film 25 is buried. The impurity is also introduced into the polysilicon film 27, so that the resistance is lowered.

All over the surface of the Si substrate including the polysilicon film 27, an epitaxial Si layer 28 having the film thickness of approximately 50 nm is formed. The active area 11 is formed so that it may include the epitaxial Si layer 28.

Furthermore, between the two adjacent trenches 12, a trench 29 for a shallow trench isolation (STI) is so formed that it passes through the epitaxial Si layer 28 and the bottom portion thereof reaches the Si substrate 21 located on the n-type buried well layer 22. A depth of the trench 29 is substantially 0.2 $\mu$m from the surface of the epitaxial Si layer 28. Furthermore, at the side of the active area 11 in the region including the trench 29 and having a wider area than the trench 29, a trench 30 (having the thickness of approximately 30 nm) which is sufficiently shallower than the trench 29 is formed. In the trenches 29 and 30, an $SiO_2$ film 31 having a planarized surface is buried.

On the epitaxial Si layer 28, a plurality of gate conductors (GC) 33 is formed via a gate oxide film 32, respectively. Each gate conductor 33 comprises a single layer comprising the polysilicon whose resistance is lowered by introducing the impurity, or a strapped layer comprising a plurality of conductive materials. In general, each gate conductor 33 comprises two layers wherein the lower layer thereof comprises a polysilicon layer and the upper layer thereof comprises a WSi layer. The gate conductors 33 are longitudinally extended as shown in FIG. 1A.

Furthermore, the channel of the MOS transistor is set in the epitaxial Si layer 28 located at the lower portion of the gate conductor 33. Source/drain diffusion layers 34 of the MOS transistor in which an n-type impurity is introduced are formed in the epitaxial Si layer 28 and Si substrate layer 21, located at both sides of the channel. The two gate conductors 33 located at the upper portion of the two adjacent trenches 12 are the gate conductors of the MOS transistor of other memory cell (not shown) passing through two memory cell areas shown in FIG. 1A. The passing gate conductor 33 is formed on the $SiO_2$ film 31 which is so formed that the trenches 29 and 30 for the STI are buried, as shown in FIG. 1B to reduce the gate-capacitance between the gate and the Si substrate.

A surface strap diffusion layer 35 in which the n-type impurity is introduced is formed in the epitaxial Si layer 28 in such a manner that the surface strap diffusion layer 35 is overlapped on the source/drain diffusion layer 34 located at the side of the trench 12 among the source/drain diffusion layers 34. In the surface strap film 35, the polysilicon film 27 formed in the trench 12 is electrically connected to the source/drain diffusion layer 34 located at the side of the trench 12. As a result, the polysilicon film 25 formed in the trench 12 and used as a capacitor storage node electrode is electrically connected to the source/drain diffusion layer 34 located at the side of the trench 12 via the surface strap film 35.

On each gate conductor 33, an $Si_3N_4$ cap film 36 having the thickness of approximately 150 nm is formed. An $Si_3N_4$ barrier film 37 is formed all over the surface including the upper portion of the cap film 36. Furthermore, a BPSG film 38 is formed on the barrier film 37 between each gate conductor. A TEOS $SiO_2$ film 39 is formed all over the surface including the upper portion of the BPSG film 38 after the BPSG planarization.

A contact hole 40 connected to the source/drain layer 34 being a common drain of two MOS transistors which are transversely adjacent to each other in FIG. 1B is opened relative to the strapped layer film comprising the TEOS $SiO_2$ film 39, the BPSG film 38 and the barrier film 37. The contact hole 40 is buried by the polysilicon whose resistance is lowered by introducing the impurity, thereby a bit line contact 41 is formed. Furthermore, in the TEOS $SiO_2$ film 39, a bit line 42 comprising, for example, a tungsten (W) film is formed. The bit line 42 is electrically connected to the source/drain diffusion layer 34 via the bit line contact 41.

Characteristics of the memory cell according to the dynamic RAM comprising the above construction are as follows:

(1) The source/drain diffusion layer 34 of the MOS transistor is connected to the polysilicon layer 25 being a trench capacitor storage node electrode via the surface strap diffusion layer 35, (2) On the same epitaxial Si layer 28 where the surface strap diffusion layer 35 is formed, the channel and the source/drain of the MOS transistor are formed, (3) The surface strap diffusion layer 35 is located on an initial DT pattern, and it is extended under the gate conductor 33 of the transistor for the adjacent memory cells, (4) The surface strap diffusion layer 35 is formed in the epitaxial Si layer 28.

According to the dynamic RAM comprising the above construction, the source/drain diffusion layer 34 of the MOS transistor is connected to the polysilicon layer 25 being the trench capacitor storage node electrode by using the surface strap diffusion layer 35. Accordingly, it is not necessary to form a side-wall diffusion layer of the side-wall of the trench which causes the asymmetrical-shaped source/drain as usual, thereby the distance (shown by S in FIG. 1A) between the gate conductor 33 of the MOS transistor and the trench 12 can be reduced. For example, this distance can be reduced to 0.15 $\mu$m and less which has been, heretofore, limited to 0.2 $\mu$m, thereby a memory cell area can be miniaturized.

Furthermore, since the surface strap diffusion layer 35 is formed in the epitaxial Si layer 28, compared to the case of using the side-wall diffusion layer as usual, a value of the contact resistance existing between the surface strap diffusion layer 35 and the epitaxial Si layer 28 is hard to vary according to a process. Accordingly, a stable contact resistance characteristic can be obtained.

Furthermore, since it is not necessary to remove the deeper side-wall diffusion layers formed at the adjacent trenches 12 as usual, the depth of the trench 29 for STI can be shallowed than usual. Furthermore, the source/drain diffusion layer 34 of the MOS transistor can be symmetrical-shaped, and the characteristic of the MOS transistor can be enhanced.

As shown in FIG. 1C, since the epitaxial Si layer 28 does not extend on the $SiO_2$ film 31, the epitaxial Si layer 28 in adjacent memory cells are not connected to each other. Accordingly, the epitaxial Si layer 28 constituting each memory cell is electrically separated by the $SiO_2$ film 31.

Next, a method of manufacturing the dynamic RAM as shown in FIGS. 1A, 1B and 1C will be explained.

In the first place, as shown in FIG. 2, the n-type impurity is implanted into the upper portion of the p-type Si substrate (P-sub) 21 by, for example, an ion implant method, and a thermal treatment is performed, so that the n-type buried well layer (N-well) 22 is formed. Next, a mask layer for a trench etching is formed on the surface of the Si substrate 21. The mask layer comprises, from the bottom, an $SiO_2$ film 51 having the film thickness of 8 nm and less, an $Si_3N_4$ film 52 having the film thickness of 100 nm and less and a TEOS $SiO_2$ film (not shown) having the film thickness of 500 nm and less. By using the mask layer, the Si substrate 21 is etched so that the deep trenches (DT) 12 having the depth of approximately 8 $\mu$m is formed. Furthermore, the impurity is diffused from an inner portion of each trench 12 to the Si substrate 21, and the n-type diffusion layer (buried plate) 23 is formed in the Si substrate 21 around the trench 12 except for the upper portion of the trench 12. As the n-type impurity, for example, an AsSG film including As is deposited all over the surface including the inner portion of the trench 12. After the AsSG film is remained in the region except for the upper portion of the trench 12, the thermal treatment is performed so that As is diffused into the Si substrate 21, thereby the diffusion layer 23 is formed. However, other methods may be used. After the diffusion layer 23 is formed, the AsSG film is removed. Next, the node dielectric film 24 is formed on the inner wall of the trench 12. As described above, as the node dielectric film 24, for example, an NO film (a stacked layer film of $Si_3N_4$ film and $SiO_2$ film) having the film thickness of, for example, 4 to 5 nm as $SiO_2$ equivalent film thickness converted into the oxide film, an $SiO_2$ film, other stacked film such as $Ta_2O_5$ film, a BST ((Ba, Sr) $TiO_3$) film, or the like having the film thickness of 4 nm and less is used. Next, the polysilicon film 25 being the storage node electrode of the trench capacitor is formed in the trench 12 covered with the node dielectric film 24. The upper surface of the polysilicon film 25 is in depth of approximately 1.0 $\mu$m from the surface of the Si substrate 21. The polysilicon film 25 is formed by a combination of a deposition using CVD method, CMP (Chemical Mechanical Polishing) method and a recess etching using the RIE method. It is necessary to lower the resistance whereby the impurity is introduced into the polysilicon film 25. However, the impurity is introduced at the same time as the polysilicon is deposited, thereby the doped polysilicon whose resistance is lowered may be formed. Furthermore, after an undoped polysilicon is deposited, the impurity may be introduced. After a formation of the polysilicon film 25, the node dielectric film 24 located on the side-wall of the upper portion of the trench 12 is removed, and the node dielectric film 24 is remained in such a manner that the node dielectric film 24 is located at the bottom portion of the trench 12 according to the n-type buried well layer 22.

Next, as shown in FIG. 3, after an oxide film having the film thickness of approximately 50 nm and less is deposited all over the surface, the deposited oxide film is etched by the RIE method, the oxide film remains and a collar oxide 53 is formed on the sidewall of the upper portion of the trench 12.

Next, as shown in FIG. 4, after the polysilicon film 27 is deposited all over the surface, the polysilicon film 27 is etched by the CMP method and the RIE method until it is located at the substantially same position as the Si surface, and the polysilicon film 27 remains in the trench 12. At the same time, the $Si_3N_4$ film 52 and the TEOS $SiO_2$ film thereon are also removed. It is necessary that the impurity is also introduced into the polysilicon film 27 in order to lower the resistance. As the method, similarly to the case of the polysilicon film 25, such a method may be used that the impurity is introduced at the same time as the polysilicon is deposited so that the polysilicon whose resistance is lowered is formed. Furthermore, such a method may be used that the impurity is introduced after the undoped polysilicon is deposited. Additionally, in order to form a good buried shape, the amorphous Si may be used. Next, in order to form well regions for n-channel and p-channel MOS transistors and to perform deep channel implants of p-channel and n-channel MOS transistors, various impurity ions are implanted into a surface region of the Si substrate 21 mainly via the remained $SiO_2$ film 51 (not shown). In this case, in order to form a shallow retrograded channel profile, instead of B ($BF_2$) and P (As) ions, In and Sb may be used (or, these well and deep channel implants can be performed through a sacrificial oxide along with the shallow channel implants as usual). Or, these well and deep channel implants can be performed before the epitaxial Si layer formation.

Next, as shown in FIG. 5, by using the CMP method, a wet etching method or the like, a portion alone projected out from the upper portion of the Si substrate 21 of the collar oxide 53 is removed. Furthermore, after the $SiO_2$ film 51 is removed. Each surface of the exposed Si substrate 21 and polysilicon film 27 is exposed. For example, a high temperature treatment is carried out in $H_2$ gas atmosphere at 850° C. for thirty minutes, for example, thereby each exposed surface is cleaned up and the native oxide is removed completely. Other native oxide removal method may be used to expose the Si surface both of the substrate 21 and the polysilicon film 27. Next, for example, by using a fast thermal process tool (FTP), an amorphous-Si film having the film thickness of approximately 60 nm is deposited all over the surface including respective surfaces of the Si substrate 21 and the polysilicon 27 and the collar oxide 53 area. Next, by using the same FTP tool used for depositing the amorphous-Si film, the thermal treatment is performed in Ar gas atmosphere at approximately 600° C. and less for about forty minutes, thereby the amorphous-Si film on the Si substrate 21 is changed to the epitaxial Si layer 28.

As shown in the FIG. 5, the film thickness of the layer 28 in the portion located on the substrate 21 is substantially equal to the thickness thereof in the portion located at the upper portion of the polysilicon films 25 and 27 and the collar oxide 53. The film thickness is also substantially uniform in the portion located at the upper portion of the polysilicon films 25 and 27 and the collar oxide 53. The amorphous-Si films on the polysilicon film 27 and the $SiO_2$ film 53 in the trench 12 is not completely changed into the epitaxial Si layer respectively, they remain as amorphous-Si layers. However, since the film on these areas is not used as the channel of the MOS transistor, it does not matter whether the quality thereof is high or not. Instead of the above method, a normal epitaxial Si growth method is used so that the epitaxial Si layer 28 can be formed. In this case, a growth temperature is 560° C., and $SiH_4$ gas is used.

Next, as shown in FIG. 6A, a mask layer comprising an $SiO_2$ film 54 and an $Si_3N_4$ film 55, having an opening at the position corresponding to the gate conductor 33 for the adjacent memory cells (shown in FIGS. 1A and 1B) passing through the memory cell area is formed. After this mask layer is used so that the n-type impurity ion is implanted into the epitaxial Si layer 28 thereby a diffusion layer 56 is formed, the same mask layer is used so that the diffusion layer 56 is etched in depth of 30 nm from the surface, thereby the trench 30 is formed. In this case, preferably, the diffusion layer 56 is etched in such a manner that edges of the bottom portion of the trench are rounded. Note that FIG.

6A corresponds to a cross section of FIG. 1B, and FIG. 6B corresponds to the cross section of FIG. 1C.

Next, as shown in FIG. 7A, a resist layer 57 having an opening in narrower region than the mask layer used for etching the diffusion layer 56 is formed between the adjacent trenches. By a non-selective RIE method using the resist layer 57, the diffusion layer 56 and the Si substrate 21 at the lower portion thereof are etched in depth of about 200 nm, thereby the trench 29 for the STI for field isolation is formed. Similarly to the above case, preferably, the diffusion layer 56 and the Si substrate 21 are etched in such a manner that the edges of the bottom portion of the trench are rounded. By such a etching, the surface strap diffusion layer 35 comprising the diffusion layer 56 is formed. Note that FIG. 7A and FIG. 7B correspond to each cross section of FIG. 1B and FIG. 1C, respectively.

Figures 8B, 8C:
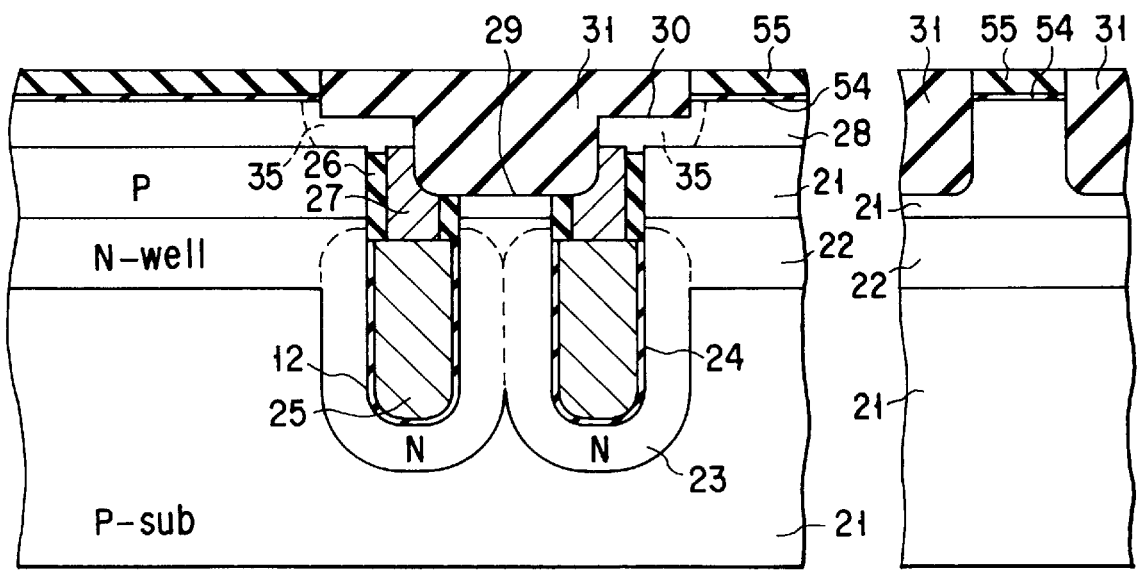
FIG. 8B is a cross sectional view taken along a line VIIIb—VIIIb of FIG. 8A.
FIG. 8C is a cross sectional view taken along a line VIIIc—VIIIc of FIG. 8A.

Next, as shown in FIGS. 8A to 8C, after the resist layer 57 is removed, the $SiO_2$ film 31 is deposited all over the surface, and a planarization is carried out by using CMP method, thereby the $SiO_2$ film 31 is remained in only the trench 29 for STI and the trench 30. When the planarization is performed by the CMP method, the $Si_3N_4$ film 55 is used as a CMP stopper layer. That is, since compared to the $SiO_2$ film 31, the $Si_3N_4$ film 55 is hard to polish, the planarization of the $SiO_2$ film 31 can be achieved. In this process, since the $Si_3N_4$ film 55 does not suffer such a process damage that the film thickness thereof is partially changed, a constant film thickness can be obtained. FIG. 8A is a plan view of a pattern, FIG. 8B is a cross sectional view taken along a line VIIIb—VIIIb of FIG. 8A, and FIG. 8C is a cross sectional view taken along a line VIIIc—VIIIc of FIG. 8A.

Next, after the $Si_3N_4$ film 55 and the $SiO_2$ film 54 at the lower portion thereof are removed, a gate sacrificial oxide is formed on the epitaxial Si layer 28. Adjustment implants (channel implants) of adjusting Vth (threshold voltage) of the MOS transistor are performed via the gate sacrificial oxide (not shown). Next, after removing the gate sacrificial oxide as shown in FIGS. 9A to 9C, gate oxide film 32 having the film thickness of approximately 8 nm, gate conductor 33, and $Si_3N_4$ cap film 36 having the film thickness of approximately 150 nm are deposited, and these cap film 36, gate conductor 33 are patterned by using a predetermined mask layer. A gate electrode structure is formed, and the gate electrode structure is used as the mask so that the n-type impurity for n-channel MOS transistor and p-type impurity for p-channel MOS transistor are implanted into the area including the epitaxial Si layer 28, thereby the source/drain diffusion layer 34 is formed. At this time, one of the source/drain diffusion layers 34 is so formed that the source/drain diffusion layer 34 is overlapped on the surface satrap film 35. After then, the $Si_3N_4$ barrier film 37 having, for example, the film thickness of approximately 30 nm and the BPSG film 38 having, for example, the film thickness of approximately 500 nm are deposited. After the planarization by the CMP method or the like, the TEOS $SiO_2$ film 39 having, for example, the film thickness of approximately 300 nm is formed. After then, as shown in FIG. 1B, the contact hole 40 is opened, the bit line contact 41 buried with the polysilicon film is formed and the bit line 42 comprising the W film is formed. An insulating film is deposited, and a contact and a wiring layer (not shown) are formed, so that the process is completed.

According to such a manufacturing method, in the epitaxial Si layer 28 where the source/drain diffusion layer 34 of the MOS transistor is formed, the surface strap film 35 is also formed in order that the source/drain diffusion layer 34 of the MOS transistor is electrically connected to the polysilicon film 25 being the storage node electrode of the trench capacitor. Accordingly, compared to the case that the deep trench (DT) 12 is formed by using the combination of the CMP method and the RIE method as usual, the number of the process steps can be reduced. For example, according to the conventional trench formation method by the combination of CMP and RIE, three-time recess processes are necessary, on the other hand, according to the above method, the recess process can be performed only twice.

Furthermore, since it is not necessary to consider the diffusion extending in the side-wall contact of the side-wall of the upper portion of the trench 12 as usual, after the deep trench (DT) 12 is formed, a trench stress relief anneal can be performed for a long time at a high temperature (for example, for sixty minutes at 1000° C.). As a result, a retention time of the memory cell can be enhanced.

Furthermore, instead of the conventional side-wall process (Buried strap method), since a planer surface process is used, the effect that a process variation such as the change of contact resistance due to a dispersion of the recess depth or the like can be reduced can be obtained.

Embodiment 2

Next, a method of manufacturing according to a second embodiment of the present invention will be explained with reference to the cross-sectional views of FIG. 10 to FIG. 12. Note that each of FIGS. 10 to 12 correspond to the cross section taken along a line Ib—Ib in the plan view of the pattern shown in FIG. 1A.

According to the method of the second embodiment, the process until the epitaxial Si layer 28 is formed all over the surface of the Si substrate 21 (shown in FIGS. 1A to 5) is similar to the process shown in the first embodiment.

Figure 10:
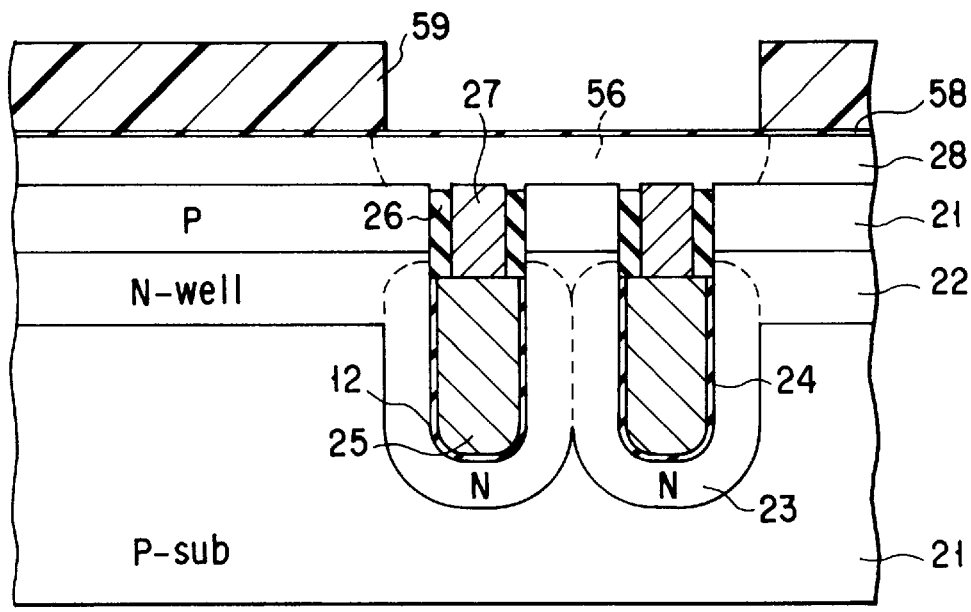
FIG. 10 is a cross sectional view of a process according to a method of manufacturing the dynamic RAM according to a second embodiment of the present invention.

Next, shown in FIG. 10, after an $SiO_2$ film 58 is formed all over the surface, a resist layer 59 having an opening at the position corresponding to the gate conductor 33 (shown in FIGS. 1A to 1C) passing through the memory cell area is formed. The resist layer 59 is used so that the n-type impurity ion is implanted into the epitaxial Si layer 28, thereby the diffusion layer 56 is formed. That is, in this process, the diffusion layer 56 is remained as it is without forming the trench 30 (shown in FIG. 6A).

Figure 11:
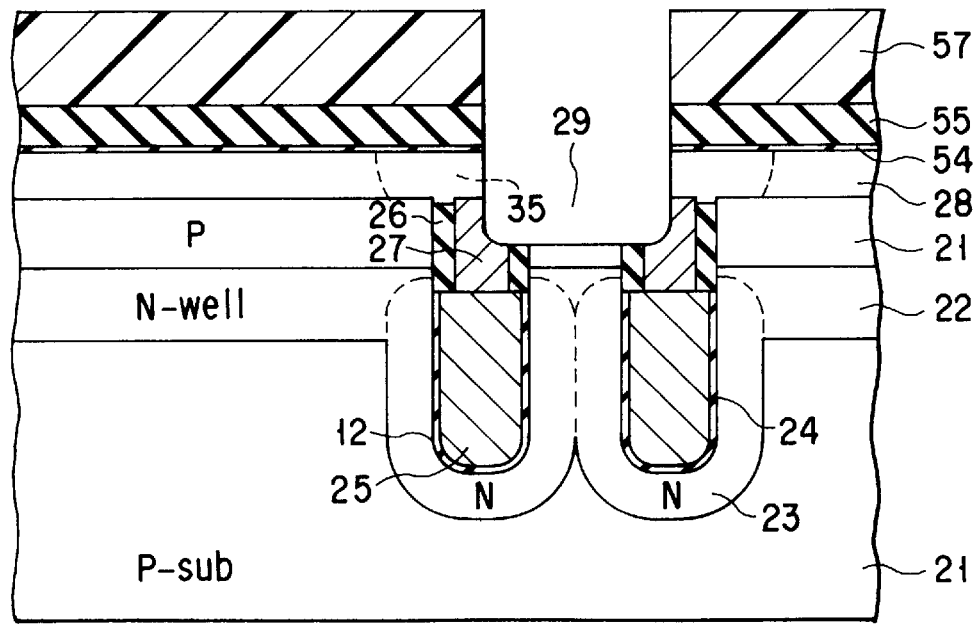
FIG. 11 is a cross sectional view showing a process next the process of FIG. 10.

Next, as shown in FIG. 11, an $SiO_2$ film 54 and an $Si_3N_4$ film 55 are deposited all over the surface. A resist layer 57 for forming STI is formed. The diffusion layer 56 and an upper portion of the Si substrate 21 are etched by nonselective RIE using the resist layer 57, thereby forming a trench 29 about 200 nm deep, for achieving STI. At this time, preferably, the diffusion layer 56 and the Si substrate 21 are etched in such a manner that the edges of the bottom portion of the trench are rounded. By such a etching, the surface strap diffusion layer 35 comprising the diffusion layer 56 is formed.

Next, after the resist layer 57 is removed, an $SiO_2$ film 31 is deposited all over the surface, and the $SiO_2$ film 31 is polished by the CMP method so that the planarization is performed. Thereby, as shown in FIG. 12, the $SiO_2$ film 31 is remained in the trench 29 for STI. Even if the planarization is performed by using CMP, the $Si_3N_4$ film 55 is used as a stopper material for polishing when the CMP method is carried out.

After then, the $Si_3N_4$ film 55 and the $SiO_2$ film 54 at the lower portion thereof are removed, and the gate sacrificial oxide is formed on the epitaxial Si layer 28. The well formation and the adjustment implants (channel implants) for adjusting Vth (threshold voltage) of the transistor is performed through the gate sacrificial oxide. Next, after removing the gate sacrificial oxide, a gate oxide film 32 having the film thickness of approximately 8 nm, a gate conductor 33 and an Si$_3$N$_4$ cap film 36 having the film thickness of approximately 150 nm are deposited, and a predetermined mask layer is used so that the cap film 36, the gate conductor 33 is patterned, thereby the gate electrode structure is formed. Since the next processes are similar to the processes described in the first embodiment, an explanation is omitted. In addition, the SiO$_2$ film 54 can be used as the sacrificial oxide in the same way as the first embodiment.

In the dynamic RAM manufactured by this method, the SiO$_2$ film 31 is formed at the lower portion of the gate conductor 33 passing through the memory cell area in such a manner that an inside of the trench 29 for STI is buried, and the shallow trench 30 shown in FIG. 1B does not exist. That is, in the dynamic RAM manufactured by the method according to the second embodiment, the above thick SiO$_2$ film 31 does not exist between the gate conductor 33 passing through the memory cell area and the surface strap diffusion layer 35. Accordingly, although the dynamic RAM comprising such a construction has a gate capacitance between the gate electrode and the Si substrate, the process for forming the shallow trench 30 (shown in FIG. 1B) can be omitted.

Furthermore, the implant for forming the surface strap diffusion layer 35 can be performed through the gate sacrificial oxide when the formation of wells relative to the epitaxial Si layer 28 and the channel implants for adjusting Vth (threshold voltage) of the transistor are performed. Accordingly, according to the method of the second embodiment, compared to that of the first embodiment, it is possible to largely simplify the manufacturing process. The impurity may be diffused from the polysilicon film 27 into the epitaxial Si layer 28 by changing the conditions of the heat treatment. In this case, the surface strap diffusion layer 35 can be formed in self-alignment, without impurity ions into the layer 28 from the exposed surface thereof.

Embodiment 3

Next, the method of manufacturing according to a third embodiment of the present invention will explained with reference to the cross-sectional view of FIG. 13. FIG. 13 corresponds to the cross section taken along the line Ib—Ib in the plan view of the pattern shown in FIG. 1A.

In the method according to the third embodiment, after an SiO$_2$ film 31 is formed by the method according to the second embodiment in such a manner that a inside of a trench 29 for STI is buried, a gate oxide film 32 is formed by which the surface is thermal-oxidized in an oxidation atmosphere. An oxidation rate of a surface strap diffusion layer 35 in which the n-type impurity is previously introduced is different from that of the remained epitaxial Si layer 28 in which the impurity is not introduced. Accordingly, the surface is thermal-oxidized, thereby the gate oxide film 32 having the film thickness of approximately 8 nm is formed on the epitaxial Si layer 28, and an SiO$_2$ film 58 having the film thickness of, for example, approximately 15 nm which is thicker than the gate oxide film 32 is formed on the surface strap diffusion layer 35. Since the processes after this process are similar to the method according to the first embodiment, the explanation is omitted.

In the dynamic RAM manufactured by the method according to the third embodiment, since the SiO$_2$ film 58 exists, a value of the gate capacitance can be reduced, compared to the method according to the second embodiment.

Embodiment 4

Next, the method of manufacturing according to a fourth embodiment of the present invention will be explained with reference to the cross-sectional views of FIG. 14 and FIG. 15. Note that FIGS. 14 and 15 correspond to the cross section taken along the line Ib—Ib of the plan view of the pattern shown in FIG. 1A. In the method of manufacturing according to the fourth embodiment, the process until an epitaxial Si layer 28 is formed all over the surface of an Si substrate 21 (shown in FIGS. 1A to 5) is similar to the process of the first embodiment.

Next, similarly to the process according to the first embodiment shown in FIG. 6A, a mask layer comprising an SiO$_2$ film 54 and an Si$_3$N$_4$ film 55 is formed, and the mask layer is used so that the n-type impurity is implanted into the epitaxial Si layer 28, thereby a diffusion layer 56 is formed. After then, as shown in FIG. 14, the same mask layer is used so that a selective oxidation (a mini LOCOS (Local Oxidation of Silicon)) is carried out, thereby an SiO$_2$ film 60 having the film thickness which is thicker than an SiO$_2$ film 54 is self-aligned formed on the diffusion layer 56. An SiO$_2$ film 60 has the film thickness of, for example, approximately 26 nm.

After then, as shown in FIG. 15, the Si$_3$N$_4$ film 55 is removed, and an Si$_3$N$_4$ film 61 is further deposited. Furthermore, a resist layer 57 for forming STI is formed on an Si$_3$N$_4$ film 61, and the Si$_3$N$_4$ film 61 just below the resist layer 57 is firstly removed by the non-selective RIE using the resist layer 57. Next, the diffusion layer 56 and an upper portion of the Si substrate 21 are etched in depth of about 200 nm, thereby the trench 29 for STI is formed. In this case, the diffusion layer 56 and the Si substrate 21 are etched in such a manner that the edges of the bottom portion of the trench is rounded. By such a etching, a surface strap diffusion layer 35 is formed.

After then, the resist layer 57 is removed, similarly to the case of the first embodiment, an SiO$_2$ film is deposited all over the surface, and the SiO$_2$ film is polished by CMP so that the planarization is carried out. Thereby, the SiO$_2$ film is remained in only the trench 29 for STI. Even if the planarization is carried out by CMP, the Si$_3$N$_4$ film 61 is used as the CMP stopper. The processes after this process are similar to the case of the first embodiment.

In the dynamic RAM manufactured by the method according to the fourth embodiment, since the SiO$_2$ film 60 having a relatively thick film thickness is formed at the lower portion of the gate conductor 33, the value of the gate capacitance can be reduced.

Embodiment 5

Next, the method of manufacturing according to a fifth embodiment of the present invention will be explained with reference to the cross sections of FIG. 16 and FIG. 17. Note that FIGS. 16 and 17 correspond to the cross section taken along the line Ib—Ib in the plan view of the pattern shown in FIG. 1A.

In the method according to the fifth embodiment, the processes up to the process shown in FIG. 11 are similar to the method according to the second embodiment. After an SiO$_2$ film 31 is buried into a trench 29 for STI, as shown in FIG. 16, a resist layer 62 is formed on a gate sacrificial oxide 54 (or on an SiO$_2$ film 58 in case of using the SiO$_2$ film 58 as it is). After then, the resist layer 62 is used as the mask so that a gate sacrificial oxide 54 (or an SiO$_2$ film 58) is etched, thereby the gate sacrificial oxide 54 (or the SiO$_2$ film 58) remains on only a surface strap diffusion layer 35 (or the SiO$_2$ film 58).

Next, after the resist layer 62 is removed, a gate oxidation is carried out, thereby an SiO$_2$ film 63 which is thicker than the gate oxide film is formed on the surface strap diffusion layer 35. The gate oxide film 32 having the thickness of approximately 8 nm is formed on other epitaxial Si layers 28. Since the process after this process is similar to the method according to the first embodiment, the explanation is omitted.

Similarly to the above embodiment, in the dynamic RAM manufactured by the method according to the fifth embodiment, since the $SiO_2$ film 63 having a relatively thick film thickness is formed at the lower portion of the pass gate conductor, the value of the gate capacitance can be reduced.

The present invention is not limited to each embodiment described above, and various deformation can be applied to the present invention.

For example, although the case that the gate oxide film of the MOS transistor is formed by the thermal oxidation is explained above, for example, after depositing a CVD-$SiO_2$ film in the thickness of, for example, approximately 8 nm the CVD-$SiO_2$ film is annealed in an oxygen atmosphere at 900° C., whereby the gate oxide film may be formed. That is, a so-called HTO (high temperature oxide) film may be used. Not only the gate oxide film comprising the HTO film has less faulty and high quality, but also the gate oxide film having the same film quality can be formed on both the Si layers which are the amorphous layer on the polysilicon layer 27 and the collar oxide layer and the epitaxial Si layer 28 on the Si substrate. That is to say, since the oxide film which is not dependent on the crystallizability of the lower layer can be formed, the gate oxide film comprising the HTO film is more effective.

As explained above, according to the present invention, it is possible to provide the dynamic RAM structure which is easy to manufacture, wherein the memory cell area can be reduced and the method thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A dynamic RAM structure in which a plurality of memory cells consisting of a MOS transistor and a capacitor are integrated on a semiconductor substrate, comprising:

a semiconductor substrate;

a trench formed in said semiconductor substrate;

a first insulating film formed in such a manner as to cover an inner wall of a lower portion of said trench;

a second insulating film formed in such a manner as to cover an inner wall of an upper portion of said trench;

a first conductive layer for a storage electrode formed in such a manner as to bury said trench covered with said first insulating film;

a second conductive layer formed in such a manner as to bury said trench covered with said second insulating film;

a diffusion area formed in said semiconductor substrate to surround a lower portion of said trench;

a semiconductor layer formed on said substrate including said second conductive layer;

a field isolation layer having a lower surface located below an interface between said semiconductor layer and said semiconductor substrate, dividing said semiconductor layer into a plurality of active areas;

a source/drain diffusion layer of said MOS transistor formed in a first portion of said semiconductor layer; and a surface strap layer formed in a second portion of said semiconductor layer, wherein said second portion is located on said trench, and electrically connecting said second conductive layer and said source/drain diffusion layer together, said field isolation layer having a portion that overlies and extends into said surface strap layer.

2. The dynamic RAM structure according to claim 1, wherein said semiconductor layer formed on said semiconductor substrate has substantially a same film thickness as a portion located at an upper portion of said second conductive layer.

3. The dynamic RAM structure according to claim 1, wherein said semiconductor layer has a film thickness in a portion located on said substrate which is substantially the same as a film thickness thereof in the portion located at an upper portion of said second conductive layer.

4. The dynamic RAM structure according to claim 1, wherein said semiconductor layer has an epitaxial Si layer in a portion located on said substrate and an amorphous Si layer in a portion located at an upper portion of said second conductive layer for the storage electrode.

5. The dynamic RAM structure according to claim 1, wherein said semiconductor substrate has a first conductive type, said semiconductor layer has the first conductive type, and said diffusion area has a second conductive type.

6. The dynamic RAM structure according to claim 1, wherein said semiconductor layer formed on said semiconductor substrate has substantially a uniform film thickness.

7. The dynamic RAM structure according to claim 1, wherein said semiconductor layer has a substantially uniform film thickness in a third portion located at an upper portion of said second conductive layer.

8. The dynamic RAM structure according to claim 1, wherein said semiconductor layer has an epitaxial Si layer in a third portion located on said substrate and an amorphous Si layer in a fourth portion located at an upper portion of said second conductive layer for the storage electrode.

9. A dynamic RAM structure in which a plurality of memory cells consisting of a MOS transistor and a capacitor are integrated on a semiconductor substrate, comprising:

a semiconductor substrate;

a trench formed in said semiconductor substrate;

a first insulating film formed in such a manner as to cover an inner wall of a lower portion of said trench;

a second insulating film formed in such a manner as to cover an inner wall of an upper portion of said trench;

a first conductive layer for a storage electrode formed in such a manner as to bury said trench covered with said first insulating film;

a second conductive layer formed in such a manner as to bury said trench covered with said second insulating film;

a diffusion area formed in said semiconductor substrate to surround a lower portion of said trench;

a semiconductor layer formed on said substrate including said second conductive layer;

a field isolation layer having a lower surface located below an interface between said semiconductor layer and said semiconductor substrate, dividing said semiconductor layer into a plurality of active areas;

a source/drain diffusion layer of said MOS transistor formed in a first portion of said semiconductor layer; and a surface strap layer formed in a second portion of said semiconductor layer, wherein said second portion is located on said trench, and electrically connecting said second conductive layer and said source/drain diffusion layer together, said field isolation layer having a portion that overlies and extends into said surface strap layer, said portion of said field isolation layer extending at least past said second conductive layer.

10. The dynamic RAM structure according to claim 9, wherein said semiconductor layer formed on said semiconductor substrate has substantially a same film thickness in a portion located at an upper portion of said second conductive layer.

11. The dynamic RAM structure according to claim 9, wherein said semiconductor layer has a film thickness in a portion located on said substrate which is substantially the same as the film thickness thereof in the portion located at an upper portion of said second conductive layer.

12. The dynamic RAM structure according to claim 9, wherein said semiconductor layer has an epitaxial Si layer in a portion located on said substrate and an amorphous Si layer in a portion located at an upper portion of said second conductive layer for the storage electrode.

13. A dynamic RAM structure in which a plurality of memory cells consisting of a MOS transistor and a capacitor are integrated on a semiconductor substrate, comprising:

a semiconductor substrate;

a trench formed in said semiconductor substrate;

a first insulating film formed in such a manner as to cover an inner wall of a lower portion of said trench;

a second insulating film formed in such a manner as to cover an inner wall of an upper portion of said trench;

a first conductive layer for a storage electrode formed in such a manner as to bury said trench covered with said first insulating film;

a second conductive layer formed in such a manner as to bury said trench covered with said second insulating film;

a diffusion area formed in said semiconductor substrate to surround a lower portion of said trench;

a semiconductor layer formed on said substrate including said second conductive layer;

a field isolation layer having a lower surface located below an interface between said semiconductor layer and said semiconductor substrate, dividing said semiconductor layer into a plurality of active areas;

a source/drain diffusion layer of said MOS transistor formed in a first portion of said semiconductor layer;

a surface strap layer formed in a second portion of said semiconductor layer, wherein said second portion is located on said trench, and electrically connecting said second conductive layer and said source/drain diffusion layer together, said field isolation layer having a portion that overlies and extends into said surface strap layer; and a passing word line formed at least on said portion of said field isolation layer that extends past said end of said second conductive layer.

14. The dynamic RAM structure according to claim 13, wherein said semiconductor layer formed on said semiconductor substrate has substantially a same film thickness in a portion located at an upper portion of said second conductive layer.

15. The dynamic RAM structure according to claim 13, wherein said semiconductor layer has a film thickness in a portion located on said substrate which is substantially the same as the film thickness thereof in the portion located at an upper portion of said second conductive layer.

16. The dynamic RAM structure according to claim 13, wherein said semiconductor layer has an epitaxial Si layer in a portion located on said substrate and an amorphous Si layer in a portion located at an upper portion of said second conductive layer for the storage electrode.

* * * * *